United States Patent
Gaudiana et al.

(10) Patent No.: US 9,147,853 B2
(45) Date of Patent: Sep. 29, 2015

(54) ELECTRODE

(71) Applicant: Merck Patent GmbH, Darmstadt (DE)

(72) Inventors: Russell Gaudiana, Lyndeborough, NH (US); Claire Lepont, Brookline, MA (US); Michael Lee, Billerica, MA (US); Edward Lindholm, Brookline, MA (US); Dick Estes, Newton, MA (US)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 13/633,968

(22) Filed: Oct. 3, 2012

(65) Prior Publication Data

US 2013/0032204 A1 Feb. 7, 2013

Related U.S. Application Data

(63) Continuation of application No. PCT/US2011/031362, filed on Apr. 6, 2011.

(60) Provisional application No. 61/321,361, filed on Apr. 6, 2010.

(51) Int. Cl.
*H01L 31/042* (2014.01)
*H01L 51/44* (2006.01)
*H01L 31/0224* (2006.01)
*H01L 51/00* (2006.01)
*H01L 51/42* (2006.01)

(52) U.S. Cl.
CPC ...... *H01L 51/445* (2013.01); *H01L 31/022433* (2013.01); *H01L 51/0037* (2013.01); *H01L 51/422* (2013.01); *Y02E 10/549* (2013.01)

(58) Field of Classification Search
CPC ........ H01L 31/00–31/078; Y02E 10/50–10/60
USPC .................................................. 136/243–265
See application file for complete search history.

(56) References Cited

U.S. PATENT DOCUMENTS

| | | | |
|---|---|---|---|
| 4,166,919 A * | 9/1979 | Carlson | 136/257 |
| 7,772,485 B2 | 8/2010 | Guadiana | |
| 7,781,673 B2 | 8/2010 | Guadiana | |
| 2004/0069992 A1* | 4/2004 | Lin et al. | 257/79 |
| 2004/0187911 A1 | 9/2004 | Guadiana | |
| 2005/0263179 A1 | 12/2005 | Guadiana | |
| 2005/0279399 A1 | 12/2005 | Guadiana | |
| 2006/0090791 A1 | 5/2006 | Guadiana | |
| 2007/0017571 A1 | 1/2007 | Guadiana | |
| 2007/0020526 A1 | 1/2007 | Guadiana | |

(Continued)

FOREIGN PATENT DOCUMENTS

| | | |
|---|---|---|
| JP | 2006-521700 | 9/2006 |
| JP | 2009-76668 | 4/2009 |

(Continued)

OTHER PUBLICATIONS

International Search Report for international application No. PCT/US2011/031362, mailing date Jun. 30, 2011.

(Continued)

*Primary Examiner* — Bach Dinh
(74) *Attorney, Agent, or Firm* — Bowditch & Dewey, LLP; Roger P. Zimmerman

(57) ABSTRACT

Photovoltaic cells containing a novel electrode, as well as related systems, methods, modules, and components, are disclosed.

19 Claims, 3 Drawing Sheets

(56) References Cited

U.S. PATENT DOCUMENTS

| | | | |
|---|---|---|---|
| 2007/0065638 A1* | 3/2007 | Wang et al. | 428/141 |
| 2007/0181179 A1 | 8/2007 | Brabec | |
| 2007/0246094 A1 | 10/2007 | Brabec | |
| 2007/0272296 A1 | 11/2007 | Brabec | |
| 2008/0006324 A1 | 1/2008 | Berke | |
| 2008/0087324 A1 | 4/2008 | Guadiana | |
| 2008/0121281 A1 | 5/2008 | Guadiana | |
| 2008/0236657 A1* | 10/2008 | Brabec et al. | 136/252 |
| 2008/0264488 A1* | 10/2008 | Balasubramanian et al. | 136/263 |
| 2009/0183766 A1* | 7/2009 | Takahashi et al. | 136/255 |
| 2009/0211633 A1 | 8/2009 | Schilinsky | |
| 2010/0024880 A1* | 2/2010 | Lee | 136/256 |
| 2010/0032018 A1 | 2/2010 | Zhu | |
| 2010/0154886 A1* | 6/2010 | Robinson et al. | 136/256 |
| 2010/0195204 A1* | 8/2010 | Walker | 359/507 |

FOREIGN PATENT DOCUMENTS

| | | |
|---|---|---|
| JP | 2009252493 A | 10/2009 |
| WO | WO 2004/086462 | 10/2004 |
| WO | WO/2011/085004 | 7/2011 |
| WO | WO/2011/112701 | 9/2011 |

OTHER PUBLICATIONS

Office Action dated Mar. 31, 2015 in counterpart Japanese application JP 2013-503876 and English translation.

* cited by examiner

ELECTRODE

CROSS REFERENCE TO RELATED APPLICATION

This application is a continuation of co-pending international patent application PCT/US2011/031362, filed on Apr. 6, 2011, and claims benefit of U.S. provisional patent application Ser. No. 61/321,361, filed on Apr. 6, 2010. The entire disclosures of both applications are incorporated herein by reference.

TECHNICAL FIELD

This disclosure relates to photovoltaic cells having a novel electrode, as well as related systems, methods, modules, and components.

BACKGROUND

Photovoltaic cells are commonly used to transfer energy in the form of light into energy in the form of electricity. A typical photovoltaic cell includes a photoactive material disposed between two electrodes. Generally, light passes through one or both of the electrodes to interact with the photoactive material, thereby generating charge carriers (i.e., electrons and holes). As a result, the ability of the electrodes to transmit light and transport charge carriers can limit the overall efficiency of a photovoltaic cell.

SUMMARY

This disclosure is based on unexpected findings that the electrode disclosed herein (e.g., a bottom electrode) can exhibit both improved light transmittance and improved electrical conductivity compared to a conventional electrode (e.g., an indium tin oxide (ITO) electrode or an ITO/metal/ITO electrode). As a result, the electrode disclosed herein can be used to make photovoltaic cells or modules with improved transparency and efficiency.

In one aspect, this disclosure features an article that includes a first electrode, a second electrode, and a photoactive material disposed between the first and second electrodes. The first electrode includes first, second, and third layers, in which the first layer includes a grid and an electrically insulating material, the second layer is between the first and third layers and includes an electrically conductive material, and the third layer is between the second layer and the photoactive layer, and includes a hole blocking material and an electrically conductive metal oxide. The article is configured as a photovoltaic cell.

In another aspect, this disclosure features an article that includes a first electrode containing a first layer, a second electrode, and a photoactive material disposed between the first and second electrodes. The first layer includes a grid and an electrically insulating material, and has a root mean squared surface roughness of at most about 20 nm. The article is configured as a photovoltaic cell.

Embodiments can include one or more of the following optional features.

In some embodiments, the grid can include a metal or an alloy. For example, the grid can include gold, silver, copper, aluminum, nickel, palladium, platinum, titanium, or an alloy thereof.

In some embodiments, the electrically insulating material can include an acrylate polymer, a urethane polymer, an epoxy polymer, or a combination thereof.

In some embodiments, the electrically conductive material can include metal nanoparticles or an electrically conductive polymer. The metal nanoparticles can have a shape of a sphere, tube, rod, or needle. The electrically conductive polymer can include a polythiophene (e.g., doped polythiophene).

In some embodiments, the hole blocking material includes a polyamine (e.g., a polyethylenimine). In certain embodiments, at least some molecules of the hole blocking material are cross-linked by a cross-linking agent, such as an epoxy-containing compound (e.g., glycerol triglycidyl ether or glycerol diglycidyl ether).

In some embodiments, the electrically conductive metal oxide can include indium tin oxide.

In some embodiments, the first layer can have a root mean squared surface roughness of at most about 20 nm (e.g., at most about 5 nm).

In some embodiments, the first layer can have a maximum peak height of at most about 200 nm.

In some embodiments, the first electrode can have a light transmittance of at least about 70% during use of the article.

In some embodiments, the first electrode can have a sheet resistance of at most about 10 ohm/square.

In some embodiments, the electrically insulating material has a surface contacting the second layer, the grid has a surface contacting the second layer, and the surface of the electrically insulating material is substantially at the same level as the surface of the grid.

In some embodiments, the first substrate has a surface with a root mean squared surface roughness of at most about 20 nm before the grid is disposed on the first substrate. In certain embodiments, the grid is disposed on the surface.

In still another aspect, this disclosure features a method that includes disposing a grid on a first substrate to form an article, in which the grid contacts the first substrate; laminating the article with a curable material and a second substrate such that the grid and the curable material are disposed between the first and second substrates; curing the curable material; and removing the first substrate to form an electrode layer.

In some embodiments, the curable material can include an acrylate, a urethane, an epoxide, or a combination thereof. In certain embodiments, the curable material can be cured by UV irradiation, heating, or a combination thereof.

In some embodiments, the method can further include disposing an electrically conductive material on the electrode layer. In certain embodiments, the method can further include disposing a mixture on the electrically conductive material, in which the mixture can include a hole blocking material and an electrically conductive metal oxide. In certain embodiments, the method can further include disposing a photoactive layer and an electrode on the mixture to form a photovoltaic cell.

Embodiments can include one or more of the following advantages.

Without wishing to be bound by theory, it is unexpectedly discovered that an electrode including a layer containing a grid and an electrically insulating material, a layer containing an electrically conductive material, and a layer containing a hole blocking material or an electrically conductive metal oxide can exhibit both improved light transmittance and improved electrical conductivity compared to a conventional electrode (e.g., an indium tin oxide (ITO) electrode or an ITO/metal/ITO electrode).

Without wishing to be bound by theory, it is believed that including a smooth layer containing a grid and an electrically insulating material having a relatively low roughness can prevent or minimize short circuit of a photovoltaic cell (e.g., caused by a large peak on the grid) and can significantly reduce the thickness of the layers on top of this layer required to form a photovoltaic cell without causing short circuit.

Other features and advantages of the invention will be apparent from the description, drawings, and claims.

DESCRIPTION OF DRAWINGS

Like reference symbols in the various drawings indicate like elements.

DETAILED DESCRIPTION

Figure 1:
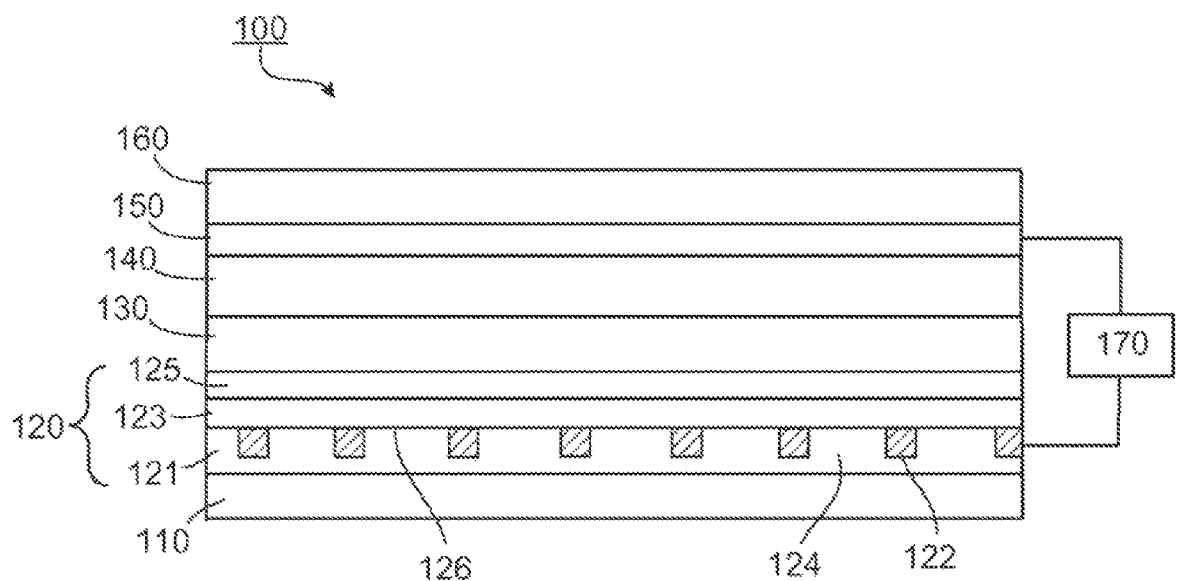
FIG. 1 is a cross-sectional view of an embodiment of a photovoltaic cell.

FIG. 1 shows a cross-sectional view of a photovoltaic cell 100 that includes a substrate 110, an electrode 120 (e.g., a bottom electrode), a photoactive layer 130 (e.g., containing an electron acceptor material and an electron donor material), an optional hole carrier layer 140, an electrode 150 (e.g., a top electrode), and a substrate 160. Electrode 120 includes a first layer 121 containing a grid 122 and an electrically insulating material 124, a second layer 123, and a third layer 125. Electrodes 120 and 150 are electrically connected to an external load 170.

In general, first layer 121 includes grid 122, which can be formed of an electrically conductive material. Exemplary electrically conductive materials include electrically conductive metals (e.g., alloys), electrically conductive polymers, and electrically conductive metal oxides. Exemplary electrically conductive metals include gold, silver, copper, aluminum, nickel, palladium, platinum, and titanium. Exemplary electrically conductive alloys include stainless steel (e.g., 332 stainless steel, 316 stainless steel), alloys of gold, alloys of silver, alloys of copper, alloys of aluminum, alloys of nickel, alloys of palladium, alloys of platinum, and alloys of titanium. Exemplary electrically conducting polymers include polythiophenes (e.g., doped poly(3,4-ethylenedioxythiophene) (doped PEDOT)), polyanilines (e.g., doped polyanilines), and polypyrroles (e.g., doped polypyrroles). Exemplary electrically conducting metal oxides include indium tin oxide (ITO), tin oxide (e.g., fluorinated tin oxide), titanium oxide, zinc oxide, tungsten oxide, molybdenum oxide, copper oxide, strontium copper oxide, and strontium titanium oxide. In some embodiments, combinations of electrically conductive materials are used.

In some embodiments, the electrically conductive material can be in the form of nanoparticles (e.g., metal nanoparticles such as silver nanoparticles).

In some embodiments, grid 122 is in the form of a mesh (e.g., when the space between the grid lines is relatively small). Examples of grid electrodes (e.g., mesh electrodes) are described in commonly owned co-pending U.S. Patent Application Publication Nos. 2004-0187911 and 2006-0090791.

In general, the dimensions of grid 122 are adjusted such that first layer 121 has sufficiently large electrical conductivity and sufficiently high transparency. In some embodiments, grid 122 has a thickness of at least about 200 nm (e.g., at least about 400 nm) and/or at most about 900 nm (e.g., at most about 800 nm), and a width of at least about 10 microns (e.g., at least about 20 microns) and/or at most about 100 microns (e.g., at most about 50 microns). If the dimensions of grid 122 are too large, first layer 121 may not have sufficient transparency. If the dimensions of grid 122 are too small, first layer 121 may not have sufficient electrical conductivity.

First layer 121 generally also includes an electrically insulating material 124 in the space formed by grid 122, which functions as a leveling layer but does not cover the surface of grid 122 contacting second layer 123. Exemplary electrically insulating polymers include acrylate polymers, urethane polymers, epoxy polymers, and combinations thereof.

In some embodiments, electrically insulating material 124 can have a thickness greater than that of grid 122. In such embodiments, as shown in FIG. 1, the surface of grid 122 contacting layer 123 and the surface of electrically insulating material 124 contacting layer 123 are substantially at the same level, while grid 122 is separated from substrate 110 by electrically insulating material 124. In certain embodiments, electrically insulating material 124 has the same thickness as that of grid 122 (not shown in FIG. 1). In some embodiments, electrically insulating material 124 can have a thickness of at least about 200 nm (e.g., at least about 1 micron, at least about 10 microns, or at least about 40 microns) and/or at most about 80 microns (e.g., at most about 60 microns, at most 40 microns, at most about 20 microns, at most about 10 microns, at most about 1 micron, or at most about 800 nm). In some embodiments, electrically insulating material 124 has a thickness of between 12 microns and 50 microns (e.g., between 12 microns and 25 microns).

Electrically insulating material 124 is generally transparent. As used herein, a transparent material refers to a material that, at the thickness used in a photovoltaic cell, transmits at least about 90% (e.g., at least about 95%, at least about 98%, or at least about 99%) of incident light at a wavelength or a range of wavelengths (e.g., from about 350 nm to about 1,000 nm) used during operation.

In general, the surface of electrically insulating material 124 contacting second layer 123 is substantially at the same level as the surface of grid 122 contacting second layer 123. As used herein, the term "substantially at the same level" refers to a surface level difference at most about 500 nm. For example, the surface of grid 122 can be at most 250 nm (e.g., at most about 200 nm, at most about 100 nm, at most about 50 nm, at most about 20 nm, or at most about 10 nm) higher or lower than the surface of electrically insulating material 124.

In general, the surface of first layer 121 contacting second layer 123, i.e., surface 126, can be relatively smooth (i.e., having a relatively low roughness). For example, surface 126 can have a root mean squared surface roughness RMS of at most about 20 nm (e.g., at most about 15 nm, at most about 10 nm, at most about 5 nm, at most about 1 nm, or at most about 0.5 nm) and/or at least about 0.1 nm (e.g., at least about 0.5 nm or at least about 1 nm). As used herein, the root mean squared surface roughness is measured by Atomic Force Microscopy. As another example, surface 126 can have a maximum peak height of at most about 200 nm (e.g., at most about 150 nm, at most about 100 nm, at most about 50 nm, at most about 20 nm, or at most about 10 nm) and/or at least about 1 nm (e.g., at least about 5 nm, at least about 10 nm, or at least about 15 nm). As used herein, the term "maximum peak height" refers to the distance from the tip of the highest peak on a surface to the level that is the average of the peaks and valleys on the surface. The maximum peak height used herein is measured by Atomic Force Microscopy. Without wishing to be bound by theory, it is believed that forming a relatively smooth surface 126 can prevent or minimize short circuit of photovoltaic cell 100 (e.g., caused by a large peak on grid 122) and can significantly reduce the thickness of the layers on top of first layer 121 required to form a photovoltaic cell without causing short circuit.

Figure 2A:
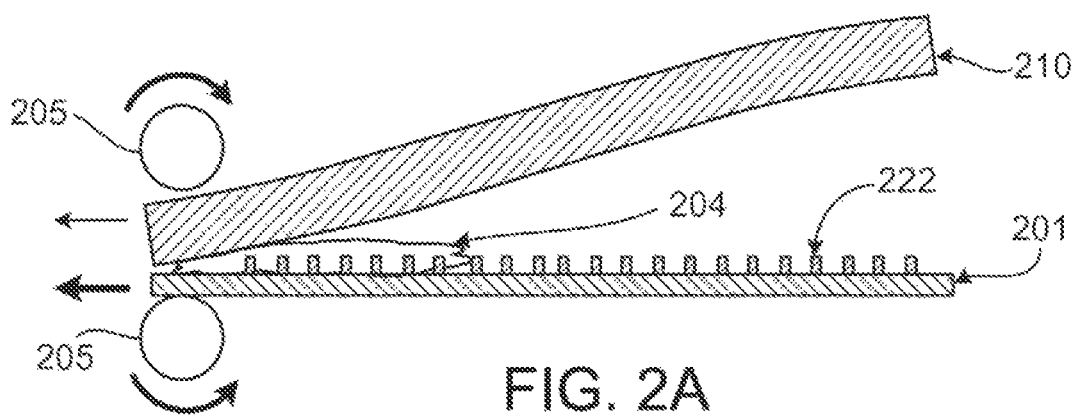
FIGS. 2(a)-2(c) illustrate an exemplary process of making the electrode shown in FIG. 1.
Figure 2B:
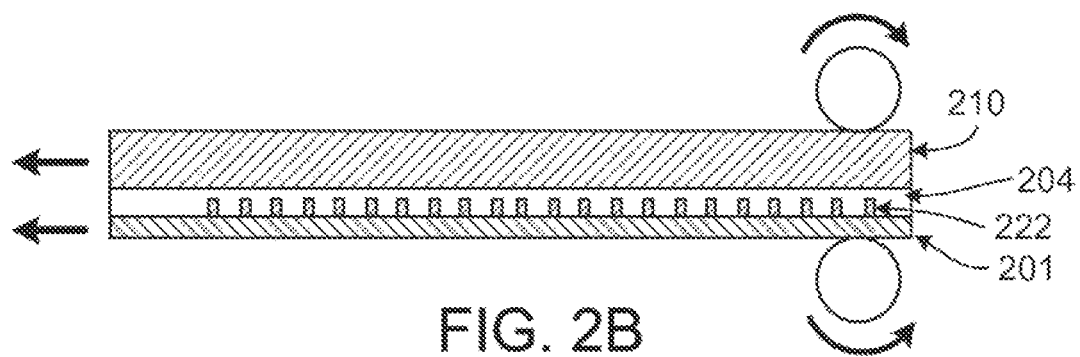
Figure 2C:
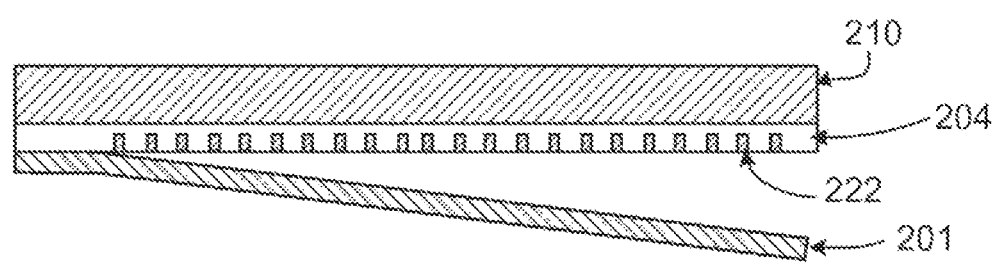

FIGS. 2(a)-2(c) illustrate an exemplary process of making first layer 121. As shown in FIG. 2(a), a grid 222 can first be coated on a smooth surface of a first substrate 201 (also known as a release substrate) to form an article. For example, an ink containing metal nanoparticles (e.g., silver nanoparticles) dispersed in a solvent (e.g., an alcohol) can be coated on a smooth surface of first substrate 201 to form metal grid 222.

In some embodiments, the surface on first substrate 201 can be relatively smooth (i.e., having a relatively low roughness) before it is coated with grid 222. For example, the surface can have a root mean squared surface roughness RMS of at most about 20 nm (e.g., at most about 15 nm, at most about 10 nm, at most about 5 nm, at most about 1 nm, or at most about 0.5 nm) and/or at least about 0.1 nm (e.g., at least about 0.5 nm or at least about 1 nm). As another example, the surface of first layer 121 contacting second layer 123 can have a maximum peak height of at most about 200 nm (e.g., at most about 150 nm, at most about 100 nm, at most about 50 nm, at most about 20 nm, or at most about 10 nm) and/or at least about 1 nm (e.g., at least about 5 nm, at least about 10 nm, or at least about 15 nm). Without wishing to be bound by theory, it is believed that coating a grid onto a relatively smooth surface on first substrate 201 can result in a smooth surface 126 on first layer 121 shown in FIG. 1 as surface 126 mimics the surface on first substrate 201 on which grid 222 is coated.

In some embodiments, first substrate 201 is formed from a polymer, e.g., polyethylene terephthalates, polyimides, polyethylene naphthalates, polymeric hydrocarbons, cellulosic polymers, polycarbonates, polyamides, polyethers, and polyether ketones. In certain embodiments, first substrate 201 is formed of a polyethylene terephthalate (PET).

After the article containing first substrate 201 and grid 222 is formed, a curable material 204 can be added onto first substrate 201 to fill the space between the grid lines formed by grid 222. The curable material can be cured (i.e., polymerized and/or cross-linked) by heat, UV irradiation, or a combination thereof, and can be a monomer or an oligomer (e.g., a pre-polymer containing less than 10 repeating units). Exemplary curable materials include acrylates (e.g., urethane acrylate oligomers) and epoxides (e.g., cyclic aliphatic epoxides). Examples of suitable epoxide includes 3,4-epoxycyclohexylmethyl-3,4-epoxycyclohexanecarboxylate and bis((3,4-epoxycyclohexyl)methyl)adipate. When an acrylate is used as a curable material, a urethane acrylate oligomer can be used as a component to form a cured material.

In some embodiments, a photoinitiator and/or a sensitizer (i.e., a compound that absorbs light at a wavelength used in the curing process) can be used in combination of curable material 140 to form a cured material (e.g., an epoxy). Examples of suitable photoinitators include iodonium salts (e.g., bis(4-tert-butylphenyl)iodonium hexaflouroantimonate). An example of a sensitizer is isopropylthioxanthone.

In general, the layer formed by curable material 204 can have a thickness the same as or larger than that of grid 222. When curable material 204 has a thickness larger than grid 222, curable material 204 covers grid 222 so that grid 222 is embedded in curable material after curing. In such embodiments, since grid 222 is already coated on first substrate 201, its surface roughness is not affected by curable material 204 after first substrate 201 is peeled off.

After curable material 204 is disposed onto first substrate 201, a second substrate 210 (also known as the receiving substrate) can be brought into contact with the article thus formed such that curable material 204 and grid 222 are disposed between first substrate 201 and second substrate 210. In some embodiments, second substrate 210 can be brought into contact with first substrate 201 before curable material 204 is disposed on first substrate 201. In such embodiments, curable material 204 can be disposed in the gap formed by first substrate 201 and second substrate 210. Second substrate 210 can be formed of the same material (e.g., PET) as that of first substrate 201. In some embodiment, second substrate 210 does not include a smooth surface.

As shown in FIG. 2(b), the article formed above can then be passed through a pair of nip rollers to laminate first substrate 201 and second substrate 210 together. Subsequently, curable material 204 can be cured by heating (e.g., at a temperature of at least about 40° C., at least about 60° C., at least about 80° C., or at least about 100° C.) or UV irradiation (e.g., having a wavelength ranging from about 200 nm to about 350 nm). In some embodiments, curable material 204 is adjusted such that it provides a sufficient adhesion between first substrate 201 and second substrate 210 so as to adhere these two substrates together during the lamination process. However, the cured material generally does not have an adhesion so high that it sticks to first substrate 201 when first substrate 201 is peeled off from the article formed above. In general, the cured material thus formed is a transparent electrically insulating material, such as urethane acrylates or cyclic aliphatic epoxies.

In some embodiments, a primer layer (e.g., containing one or more polyesters) can be coated on second substrate 210 to ensure that the cured material adheres to second substrate 210. For example, the primer layer can be formed by coating a blend of L7063/VITEL 2700/BOSCODUR 16 obtained from Bostik, Inc. (Middleton, Mass.) at a dry weight ratio of 1.67:1.0:0.054 on second substrate 210. As shown in FIG. 2(c), after the curable material is cured, first substrate 201 can be peeled off from the article formed above to form a layer containing grid 222 and a cured material (i.e., corresponding to first layer 121 shown in FIG. 1) and substrate 210 (i.e., corresponding to substrate 110 shown in FIG. 1). The exposed surface of grid 222 and the cured material after first substrate 201 is peeled off forms surface 126 shown in FIG. 1.

Without wishing to be bound by theory, an advantage of the above process is that it can form an electrode layer having a relatively smooth surface (e.g., having a root mean squared surface roughness of at most about 20 nm or having a maximum peak height of at most about 200 nm) as the surface of the electrode layer mimics the smooth surface of first substrate 201. Further, without wishing to be bound by theory, another advantage of the above process is that it can form an electrode layer in which the surface of grid 222 and the surface of the electrically insulating material formed by curable material 204 are substantially at the same level.

In some embodiments, when electrode 120 is a top electrode, the roughness of surface 126 may not be critical in preventing or minimizing short circuit of photovoltaic cells. In such embodiments, first layer 121 can be prepared by a process (e.g., by using a simple solution coating or inkjet printing method) different from that described above.

Turning to other components in electrode 120, second layer 123 generally includes an electrically conductive material, such as electrically conductive polymers, electrically conductive metals (e.g., alloys), or electrically conductive metal oxides. Exemplary electrically conductive polymers include polythiophenes (e.g., PEDOT), polyanilines, polycarbazoles, polyvinylcarbazoles, polyphenylenes, polyphenylvinylenes, polysilanes, polythienylenevinylenes, polyisothianaphthanenes, and copolymers thereof. In some embodiments, second layer 123 can include a dopant used in combination with one of the just-mentioned electrically conductive polymers. Examples of dopants include poly(styrene-sulfonate)s, polymeric sulfonic acids, or fluorinated polymers (e.g., fluorinated ion exchange polymers).

Exemplary electrically conductive metals include gold, silver, copper, aluminum, nickel, palladium, platinum, titanium, and an alloy thereof.

Exemplary electrically conductive metal oxides include ITO, tin oxide (e.g., fluorinated tin oxide), titanium oxide, zinc oxide, copper oxide, strontium copper oxide, and strontium titanium oxide. The metal oxides can be either undoped or doped with a dopant. Examples of dopants for metal oxides include salts or acids of fluoride, chloride, bromide, and iodide.

In some embodiments, the electrically conductive materials that can be used to form second layer 123 include carbon allotropes (e.g., carbon nanotubes). The carbon allotropes can be embedded in a polymer binder.

In some embodiments, the electrically conductive materials that can be used to form second layer 123 can be in the form of nanoparticles, such as metal nanoparticles. The nanoparticles can have any suitable shape, such as a spherical, cylindrical, rod-like, or needle-like shape.

In some embodiments, second layer 123 can include combinations of electrically conductive materials described above.

In some embodiments, second layer 123 can be formed of the same hole carrier material (e.g., a polythiophene) as that used to form hole carrier layer 140. In such embodiments, without wishing to be bound by theory, it is believed that the material used in second layer 123 functions as an electrically conductive material that can transport charge carriers (e.g., electrons) from the hole blocking material used in third layer 125 to grid 122.

In general, the thickness of second layer 123 can be varied as desired. Typically, the thickness of second layer 123 is at least about 100 nm (e.g., at least about 150 nm, at least about 200 nm, at least about 250 nm, or at least about 300 nm) and/or at most about 450 nm (e.g., at most about 400 nm, at most about 350 nm, at most about 300 nm, at most about 250 nm, at most about 200 nm, or at most about 150 nm). Without wishing to be bound by theory, it is believed that, as surface 126 on first layer 121 has a relatively low roughness, second layer 123 do not need have a large thickness to cover the peaks on surface 126 to prevent short circuit and therefore can be made relatively thin to minimize absorption loss of incident light while still providing sufficient electrical conductivity to transport charge carriers to grid 122.

In some embodiments, second layer 123 can have a thickness of between about 100 nm and about 200 nm. Without wishing to be bound by theory, it is believed that including second layer 123 having the above thickness can provide sufficient electrical conductivity to electrode 120 while still maintain the transparency of this electrode. Further, without wishing to be bound by theory, it is believed that including second layer 123 having the above thickness in a bottom electrode can result in a photovoltaic cell with significantly higher current density than a photovoltaic cell including an ITO/metal/ITO bottom electrode.

Without wishing to be bound by theory, it is believed that including second layer 123 in electrode 120 can facilitate transport of charge carriers (e.g., electrons) from the space between the grid lines formed by grid 122 to grid 122, thereby improving the efficiency of photovoltaic cell 100.

In some embodiments, when second layer 123 contains electrically conductive metal (e.g., metal nanoparticles), the metal can be applied to first substrate 201 shown in FIG. 2(a) before grid 222 is disposed on first substrate 201. In such embodiments, after first substrate 201 is peeled off as shown in FIG. 2(c), second layer 123 is formed as a smooth layer on top of the layer containing grid 222 and a cured material. Without wishing to be bound by theory, it is believed that this process can significantly minimize the possibility that the metal nanoparticles causes short circuit in photovoltaic cell 100 as compared to applying the metal nanoparticles directly onto a smooth layer containing grid 222 and a cured material formed in the process shown in FIGS. 2(a)-2(c).

Third layer 125 generally includes a hole blocking material and an electrically conductive metal oxide (e.g., ITO). The hole blocking material is generally a material that, at the thickness used in photovoltaic cell 100, transports electrons to grid 122 and substantially blocks the transport of holes to grid 122. Exemplary hole blocking materials include polyamines (e.g., polyethylenimines). As used herein, the term "polyamine" refers to a polymer having two or more amino groups, including primary amino groups, secondary amino groups, and tertiary amino groups. Other examples of the hole blocking material have been described in, e.g., commonly-owned co-pending U.S. Application Publication No. 2008-0264488.

Without wishing to be bound by theory, it is believed that when photovoltaic cell 100 includes a hole blocking material, the hole blocking material can facilitate the formation of ohmic contact between photoactive layer 130 and electrode 120 without being exposed to UV light, thereby reducing damage to photovoltaic cell 100 resulted from UV exposure.

In some embodiments, third layer 125 can further include a cross-linking agent. Exemplary cross-linking agents include epoxy-containing compounds, such as glycerol triglycidyl ether and glycerol diglycidyl ether (e.g., 1,3-diglycidyl glyceryl ether). In certain embodiments, at least some of the molecules of the hole blocking material can be cross-linked via the cross-linking agent.

Exemplary electrically conductive metal oxide that can be used in third layer 125 include ITO, tin oxide (e.g., fluorinated tin oxide), titanium oxide, zinc oxide, copper oxide, strontium copper oxide, and strontium titanium oxide. In some embodiments, the electrically conductive metal oxide can be in the form of nanoparticles (e.g., ITO nanoparticles).

In some embodiments, when hole carrier layer is present in photovoltaic cell 100, third layer 125 can have a work function different from hole carrier layer 140, thereby creating an electric field to facilitate separation of charge carriers (i.e., electrons or holes) and transfer charge carriers from photoactive layer 130 to electrodes 120 and 150 during use of photovoltaic cell 100. Without wishing to be bound by theory, it is believed that, due to this work function difference, one can include the material used in hole carrier layer 140 into second layer 123 to serve as an electrically conductive material to facilitate transport of charge carriers (e.g., electrons) from the space between the grid lines formed by grid 122 to grid 122. Without wishing to be bound by theory, the above configuration would not be feasible in the absence of third layer 125 as there would not electric field in photovoltaic cell 100 to facilitate separation and transfer of charge carriers. Further, without wishing to be bound by theory, due to the work function difference between third layer 125 and hole carrier layer 140, one can use the same material (e.g., a metal such as silver) to form electrode 150 and grid 122 for the same reason set forth above. In addition, without wishing to be bound by theory, it is believed that including an electrically conductive metal oxide can significantly increase the electrical conductivity of third layer 125 (as the hole blocking material in layer 125 is generally electrically insulating) and improve the conductivity of electrode 120.

In some embodiments, the electrically conductive metal oxide, the hole blocking material, and the cross-linking agent in third layer 125 can have a weight ratio of at least about 1:1:1 (e.g., at least about 2:1:1, at least about 3:1:1, or at least about 4:1:1) and/or at most about 8:1:1 (e.g., at most about 7:1:1, at most about 6:1:1, or at most about 5:1:1). Without wishing to be bound by theory, the inventors unexpected discovered that lowering the level of the electrically conductive metal oxide (e.g., to about 3:1:1 or less) can significantly reducing shunting of photovoltaic cell 100. On the other hand, without wishing to be bound by theory, it is believed that photovoltaic cell 100 having a level of the electrically conductive metal oxide that is too low (e.g., less than to about 1:1:1) can significantly lower the fill factor.

In some embodiments, third layer 125 has a thickness of at most about 150 nm (e.g., at most about 120 nm, at most about 100 nm, at most about 50 nm, or at most about 10 nm) or at least about 20 nm (e.g., at least about 30 nm, at least about 40 nm, at least about 50 nm). In some embodiments, third layer 125 has a thickness between about 40 nm and about 100 nm (e.g., about 50, 60, or 75 nm).

In some embodiments, electrode 120 is a bottom electrode in photovoltaic cell 100. As used herein, the term "bottom electrode" refers to an electrode onto which other layers (e.g., a photoactive layer and the counter electrode) are applied to form a photovoltaic cell. In such embodiments, electrode 150 is a top electrode in photovoltaic cell 100.

In general, electrode 120 is transparent. For example, electrode 120 can transmit at least about 70% (e.g., at least about 75%, at least about 80%, at least about 85%, at least about 90%, or at least about 95%) of incident light at a wavelength or a range of wavelengths (e.g., from about 350 nm to about 1,000 nm) used during operation. Without wishing to be bound by theory, it is believed that an advantage of electrode 120 is that it possesses a flatter transmission curve compared to rounded transmission curves of a conventional ITO or IMI electrode, and therefore is generally more transparent in a wide range of light wavelength (e.g., from about 350 nm to about 1,000 nm) than such a conventional electrode. In some embodiments, electrode 120 can transmit between 72% and 90% (e.g., between 75% and 85%) of incident light.

In general, electrode 120 is electrically conductive. For example, electrode 120 can have a sheet resistance of at most about 10 ohm/square (e.g., at most about 8 ohm/square, at most about 6 ohm/square, at most about 4 ohm/square, at most about 2 ohm/square, at most about 1 ohm/square) and/or at least about 0.01 ohm/square (e.g., at least about 0.05 ohm/square, at least about 0.1 ohm/square, or at least about 0.5 ohm/square). In some embodiments, electrode 120 can have a sheet resistance between about 4 ohm/square and about 6 ohm/square (e.g., 5 ohm/square).

Without wishing to be bound by theory, it is unexpectedly discovered that including all of first layer 121, second layer 123, and third layer 125 described above in electrode 120 can result in an electrode that exhibits both improved light transmittance and improved electrical conductivity compared to a conventional electrode (e.g., an indium tin oxide (ITO) electrode or an ITO/metal/ITO electrode). As a result, a photovoltaic cell containing such an electrode can have improved efficiency and cell performance.

Turning to other components in photovoltaic cell 100, substrate 110 is generally formed of a transparent material. Exemplary materials from which substrate 110 can be formed include polyethylene terephthalates, polyimides, polyethylene naphthalates, polymeric hydrocarbons, cellulosic polymers, polycarbonates, polyamides, polyethers, and polyether ketones. In certain embodiments, the polymer can be a fluorinated polymer. In some embodiments, combinations of polymeric materials are used. In certain embodiments, different regions of substrate 110 can be formed of different materials.

In general, substrate 110 can be flexible, semi-rigid or rigid (e.g., glass). In some embodiments, substrate 110 has a flexural modulus of less than about 5,000 megaPascals (e.g., less than about 1,000 megaPascals or less than about 500 megaPascals). In certain embodiments, different regions of substrate 110 can be flexible, semi-rigid, or inflexible (e.g., one or more regions flexible and one or more different regions semi-rigid, one or more regions flexible and one or more different regions inflexible).

Typically, substrate 110 is at least about one micron (e.g., at least about five microns or at least about 10 microns) thick and/or at most about 1,000 microns (e.g., at most about 500 microns, at most about 300 microns, at most about 200 microns, at most about 100 microns, or at most about 50 microns) thick.

Generally, substrate 110 can be colored or non-colored. In some embodiments, one or more portions of substrate 110 is/are colored while one or more different portions of substrate 110 is/are non-colored.

Substrate 110 can have one planar surface (e.g., the surface on which light impinges), two planar surfaces (e.g., the surface on which light impinges and the opposite surface), or no planar surfaces. A non-planar surface of substrate 110 can, for example, be curved or stepped. In some embodiments, a non-planar surface of substrate 110 is patterned (e.g., having patterned steps to form a Fresnel lens, a lenticular lens or a lenticular prism).

Photoactive layer 130 is generally formed of an electron acceptor material (e.g., an organic electron acceptor material) and an electron donor material (e.g., an organic electron donor material).

In some embodiments, the electron donor material can include a photoactive polymer (e.g., a conjugated polymer) containing one or more of the following monomer repeat units: a benzodithiophene moiety, a cyclopentadithiazole moiety, a benzothiadiazole moiety, a thiadiazoloquinoxaline moiety, a benzoisothiazole moiety, a benzothiazole moiety, a dithienopyrrole moiety, a dibenzosilole moiety, a thienothiophene moiety, a carbazole moiety, a dithienothiophene moiety, a tetrahydroisoindole moiety, a fluorene moiety, a silole moiety, a cyclopentadithiophene moiety, a thiazole moiety, a selenophene moiety, a thiazolothiazole moiety, a naphthothiadiazole moiety, a thienopyrazine moiety, a silacyclopentadithiophene moiety, a thiophene moiety, an oxazole moiety, an imidazole moiety, a pyrimidine moiety, a benzoxazole moiety, a benzimidazole moiety, a quinoxaline moiety, a pyridopyrazine moiety, a pyrazinopyridazine moiety, a pyrazinoquinoxaline moiety, a thiadiazolopyridine moiety, a thiadiazolopyridazine moiety, a benzooxadiazole moiety, an oxadiazolopyridine moiety, an oxadiazolopyridazine moiety, a benzoselenadiazole moiety, a benzobisoxazole moiety, a thienothiadiazole moiety, a thienopyrroledione moiety, or a tetrazine moiety. The moieties mentioned above can be substituted by one or more halo (e.g., F, Cl, Br, or I), $C_1$-$C_{24}$ alkyl, $C_1$-$C_{24}$ alkoxy, aryl, heteroaryl, $C_3$-$C_{24}$ cycloalkyl, $C_3$-$C_{24}$ heterocycloalkyl, COR, COOR, CO—N(RR'), CN, or $SO_3R$, in which each of R and R', independently, is H, $C_1$-$C_{24}$ alkyl, aryl, heteroaryl, $C_3$-$C_{24}$ cycloalkyl, or $C_3$-$C_{24}$ heterocycloalkyl. The photoactive polymer can be a homopolymer or a copolymer containing two or more of the above monomer repeat units.

In some embodiments, electron acceptor materials of photoactive layer 130 can include fullerenes. In some embodiments, photoactive layer 130 can include one or more unsubstituted fullerenes and/or one or more substituted fullerenes. Examples of unsubstituted fullerenes include $C_{60}$, $C_{70}$, $C_{76}$, $C_{78}$, $C_{82}$, $C_{84}$, and $C_{92}$. Examples of substituted fullerenes include fullerene substituted with phenyl-butyric acid methyl esters (PCBMs, such as C61-PCBM and C71-PCBM) or fullerenes substituted with $C_1$-$C_{20}$ alkoxy optionally further substituted with $C_1$-$C_{20}$ alkoxy and/or halo (e.g., $(OCH_2CH_2)_{20}CH_3$ or $OCH_2CF_2OCF_2CF_2OCF_3$). Without wishing to be bound by theory, it is believed that fullerenes substituted with long-chain alkoxy groups (e.g., oligomeric ethylene oxides) or fluorinated alkoxy groups have improved solubility in organic solvents and can form a photoactive layer with improved morphology. Other examples of fullerenes have been described in, e.g., commonly-owned co-pending U.S. Application Publication No. 2005-0279399. In some embodiments, the electron acceptor material can include one or more of the photoactive polymers described in the preceding paragraph. In certain embodiments, a combination of electron acceptor materials (e.g., a fullerene and a photoactive polymer described above) can be used in photoactive layer 130.

Other examples of electron donor materials and electron accepting materials have been described in, e.g., commonly-owned U.S. Pat. Nos. 7,772,485, and 7,781,673, U.S. Application Publication Nos. 2007-0017571, 2007-0020526, 2008-0087324, 2008-0121281, and 2010-0032018, and PCT Application No PCT/US2011/020227.

In general, the thickness of photoactive layer 130 should be sufficiently large to absorb incident light to generate electrons and holes, and sufficiently small to allow transport of the generated electrons or holes to a neighboring layer. Typically, the thickness of photoactive layer 130 is at least about 50 nm (e.g., at least about 75 nm, at least about 100 nm, at least about 125 nm, at least about 150 nm, or at least about 200 nm) and/or at most about 300 nm (e.g., at most about 250 nm, at most about 200 nm, or at most about 150 nm). In some embodiments, the thickness of photoactive layer 130 is between about 210 nm and about 230 nm (e.g., about 220 nm).

Optionally, photovoltaic cell 100 can include a hole carrier layer 140. Hole carrier layer 140 is generally formed of a material that, at the thickness used in photovoltaic cell 100, transports holes to electrode 150 and substantially blocks the transport of electrons to electrode 150. Examples of materials from which layer 140 can be formed include polythiophenes (e.g., PEDOT), polyanilines, polycarbazoles, polyvinylcarbazoles, polyphenylenes, polyphenylvinylenes, polysilanes, polythienylenevinylenes, polyisothianaphthanenes, and copolymers thereof. In some embodiments, hole carrier layer 140 can include a dopant used in combination with one of the just-mentioned materials. Examples of dopants include poly(styrene-sulfonate)s, polymeric sulfonic acids, or fluorinated polymers (e.g., fluorinated ion exchange polymers).

In some embodiments, the materials that can be used to form hole carrier layer 140 include metal oxides, such as tungsten oxide or molybdenum oxide. The metal oxides can be either undoped or doped with a dopant. Examples of dopants for metal oxides include salts or acids of fluoride, chloride, bromide, and iodide.

In some embodiments, hole carrier layer 140 can include combinations of hole carrier materials described above.

In general, the thickness of hole carrier layer 140 (i.e., the distance between the surface of hole carrier layer 140 in contact with photoactive layer 130 and the surface of electrode 150 in contact with hole carrier layer 140) can be varied as desired. Typically, the thickness of hole carrier layer 140 is at least about 100 nm (e.g., at least about 150 nm, at least about 200 nm, at least about 250 nm, at least about 300 nm) and/or at most about 500 nm (e.g., at most about 450 nm, at most about 400 nm, at most about 350 nm, at most about 300 nm, at most about 250 nm, or at most about 200 nm). In some embodiments, the thickness of hole carrier layer 140 is from about 180 nm to about 220 nm.

Electrode 150 is generally formed of an electrically conductive material, such as one or more of the electrically conductive materials described above with respect to grid 122. In some embodiments, electrode 150 is formed of a combination of electrically conductive materials. In certain embodiments, electrode 150 can be formed of a mesh or grid electrode. In other embodiments, electrode 150 can be formed from metal nanoparticles (e.g., silver nanorods) dispersed in a polymer matrix, such as that disclosed in commonly-owned co-pending U.S. Application Publication No 2008-0236657.

In general, substrate 160 can serve as a barrier layer and can be made from materials that sufficiently prevent diffusion of oxygen or moisture in the environment into photovoltaic cell 100. In some embodiments, substrate 160 has a multilayer structure and includes a composite containing at least two (e.g., at least three) polymer layers (e.g., each containing a polyester such as a polyethylene terephthalate or a polyethylene naphthalate) and at least two ceramic layers (e.g., each containing silica or alumina) between the at least two polymer layers. In such embodiments, substrate 160 can have three polymer layers and two ceramic layers in the following order: a polymer layer, a ceramic layer, a polymer layer, a ceramic layer, and a polymer layer.

In some embodiments, when electrode 150 is made from a transparent material, substrate 160 can also be made from a transparent material (e.g., the multilayer structure described in the preceding paragraph). In certain embodiments, when electrode 150 is not transparent, barrier layer 190 can include a metal foil. Without wishing to be bound by theory, it is believed that a metal foil is generally a better barrier material than a composite material formed from polymers and ceramics. On the other hand, as a metal foil is generally less transparent than a composite material formed from polymers and ceramics, it is typically used only on the side of photovoltaic cell 100 that is not transparent.

In some embodiments, photovoltaic cell 100 can include a buffer layer between electrode 150 and substrate 160 to prevent delamination of substrate 160 and to increase the useable life of photovoltaic cell 100. Examples of such a buffer layer have been described in, for example, commonly-owned co-pending PCT/US2011/027722.

In general, the methods of preparing layers 123, 125, 130, 140, and 150 in photovoltaic cell 100 described above can vary as desired. In some embodiments, such a layer can be prepared by a liquid-based coating process. In certain embodiments, such a layer can be prepared by a gas phase-based coating process, such as chemical or physical vapor deposition processes.

The term "liquid-based coating process" mentioned herein refers to a process that uses a liquid-based coating composition. Examples of the liquid-based coating composition include solutions, dispersions, or suspensions. The liquid-based coating process can be carried out by using at least one of the following processes: solution coating, ink jet printing, spin coating, dip coating, knife coating, bar coating, spray coating, roller coating, slot coating, gravure coating, flexographic printing, or screen printing. Examples of liquid-based coating processes have been described in, for example, commonly-owned co-pending U.S. Application Publication No. 2008-0006324.

In some embodiments, when a layer includes inorganic semiconductor nanoparticles, the liquid-based coating process can be carried out by (1) mixing the nanoparticles with a solvent (e.g., an aqueous solvent or an anhydrous alcohol) to form a dispersion, (2) coating the dispersion onto a substrate, and (3) drying the coated dispersion. For example, third layer 125 can be prepared by mixing metal oxide nanoparticles (e.g., ITO nanoparticles) with a solution containing a polyamine (e.g., a polyethylenimine) and a solvent to form a dispersion, coating the dispersion on second layer 123, and drying (e.g., by heating) the coated dispersion. The solution containing the polyamine can further include a cross-linking agent (e.g., glycerol diglycidyl ether), which can cross-link the polyamine during the drying process. In certain embodiments, a liquid-based coating process for preparing a layer containing inorganic metal oxide nanoparticles can be carried out by (1) dispersing a precursor (e.g., a titanium salt) in a suitable solvent (e.g., an anhydrous alcohol) to form a dispersion, (2) coating the dispersion on a substrate, (3) hydrolyzing the dispersion to form an inorganic semiconductor nanoparticles layer (e.g., a titanium oxide nanoparticles layer), and (4) drying the inorganic semiconductor material layer. In certain embodiments, the liquid-based coating process can be carried out by a sol-gel process (e.g., by forming metal oxide nanoparticles as a sol-gel in a dispersion before coating the dispersion on a substrate).

In general, the liquid-based coating process used to prepare a layer containing an organic semiconductor material can be the same as or different from that used to prepare a layer containing an inorganic semiconductor material. In some embodiments, to prepare a layer includes an organic semiconductor material, the liquid-based coating process can be carried out by mixing the organic semiconductor material with a solvent (e.g., an organic solvent) to form a solution or a dispersion, coating the solution or dispersion on a substrate, and drying the coated solution or dispersion. For example, second layers 123, photoactive layer 130, and hole carrier layer 140 can be prepared by this method.

In some embodiments, electrode 150 can be prepared either by a gas phase-based coating process (e.g., applying a metal layer onto optional hole carrier layer 140 by using a chemical vapor deposition process) or a liquid-based coating process (e.g., applying a metal mesh layer onto optional hole carrier layer 140 by an inkjet printing process).

In some embodiments, substrate 160 can be attached to electrode 150 by methods known in the art (e.g., by using an adhesive).

In some embodiments, photovoltaic cell 100 can be prepared in a continuous manufacturing process, such as a roll-to-roll process, thereby significantly reducing the manufacturing cost. Examples of roll-to-roll processes have been described in, for example, commonly-owned co-pending U.S. Application Publication No. 2005-0263179.

In general, during use, incident light can impinge on the surface of substrate 110, and passes through substrate 110 and electrode 120. The light then interacts with photoactive layer 130, causing electrons to be transferred from the electron donor material (e.g., a conjugated polymer) to the electron acceptor material (e.g., a substituted fullerene). The electron acceptor material then transmits the electrons through third layer 125 and second layer 123 to grid 122 in electrode 120, and the electron donor material transfers holes through hole carrier layer 140 to electrode 150. Electrodes 120 and 150 are in electrical connection via an external load 170 so that electrons pass from electrode 120 through the load to electrode 150. When substrate 160 and electrode 150 are transparent, incident light can also pass through these two layers to interact with photoactive layer 130 to generate electrons and holes.

While certain embodiments have been disclosed, other embodiments are also possible.

In some embodiments, photovoltaic cell 100 can be a tandem photovoltaic cell, such as those described in commonly-owned co-pending U.S. Application Publication Nos. 2007-0246094, 2007-0181179, 2007-0272296, and 2009-0211633.

In some embodiments, photovoltaic cell 100 includes a cathode as a bottom electrode and an anode as a top electrode. In some embodiments, photovoltaic cell 100 can include an anode as a bottom electrode and a cathode as a top electrode.

In some embodiments, photovoltaic cell 100 can include the layers shown in FIG. 1 in a reverse order. In other words, photovoltaic cell 100 can include these layers from the bottom to the top in the following sequence: a substrate 160, an electrode 150, an optional hole carrier layer 140, a photoactive layer 130, an electrode 120 containing a third layer 125, a second layer 123, and a first layer 121, and a substrate 110. In such embodiments, electrode 150 is a bottom electrode and electrode 120 is a top electrode. In such embodiments, without wishing to be bound by theory, the surface on first layer 121 contacting second layer 123 can have a surface roughness larger than that of surface 126 shown in FIG. 1 as the roughness of this surface is not critical in preventing or minimizing short circuit of photovoltaic cell 100.

Figure 3:
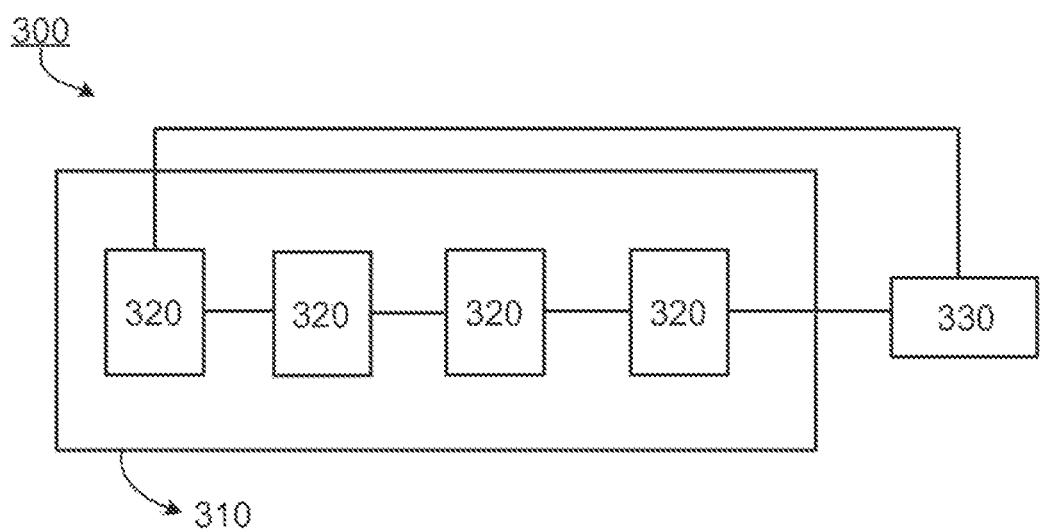
FIG. 3 is a schematic of a system containing multiple photovoltaic cells electrically connected in series.
Figure 4:
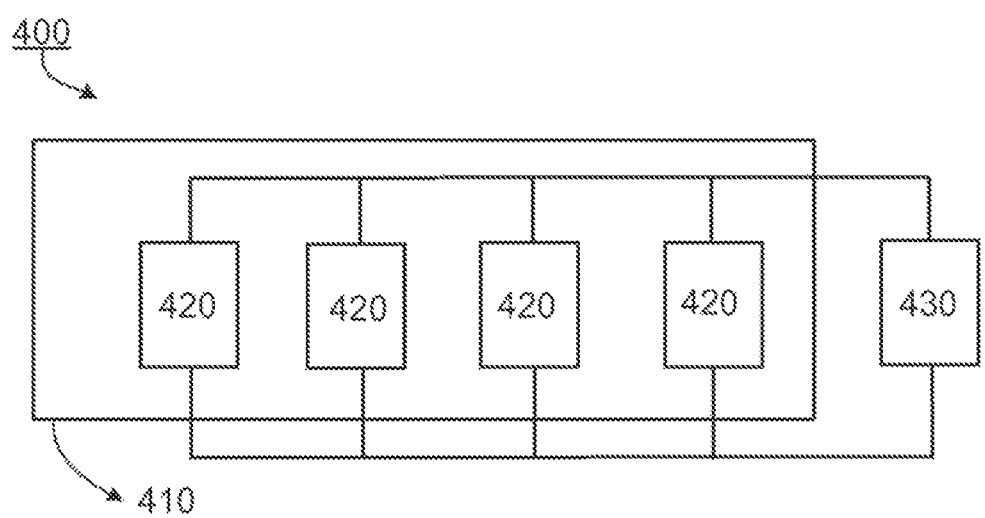
FIG. 4 is a schematic of a system containing multiple photovoltaic cells electrically connected in parallel.

In some embodiments, multiple photovoltaic cells can be electrically connected to form a photovoltaic system. As an example, FIG. 3 is a schematic of a photovoltaic system 300 having a module 310 containing a plurality of photovoltaic cells 320. Cells 320 are electrically connected in series, and system 300 is electrically connected to a load 330. As another example, FIG. 4 is a schematic of a photovoltaic system 400 having a module 410 that contains a plurality of photovoltaic cells 420. Cells 420 are electrically connected in parallel, and system 400 is electrically connected to a load 430. In some embodiments, some (e.g., all) of the photovoltaic cells in a photovoltaic system can be disposed on one or more common substrates. In certain embodiments, some photovoltaic cells in a photovoltaic system are electrically connected in series, and some of the photovoltaic cells in the photovoltaic system are electrically connected in parallel.

While organic photovoltaic cells have been described, electrode 120 described herein can also be used in other photovoltaic cells. Examples of such photovoltaic cells include dye sensitized photovoltaic cells and inorganic photoactive cells with a photoactive material formed of amorphous silicon, cadmium selenide, cadmium telluride, copper indium selenide, and copper indium gallium selenide. In some embodiments, electrode 120 can be used in a hybrid photovoltaic cell.

While photovoltaic cells have been described above, in some embodiments, electrode 120 described herein can be used in other devices and systems. For example, electrode 120 can be used in suitable organic semiconductive devices, such as field effect transistors, photodetectors (e.g., IR detectors), photovoltaic detectors, imaging devices (e.g., RGB imaging devices for cameras or medical imaging systems), light emitting diodes (LEDs) (e.g., organic LEDs (OLEDs) or IR or near IR LEDs), lasing devices, conversion layers (e.g., layers that convert visible emission into IR emission), amplifiers and emitters for telecommunication (e.g., dopants for fibers), storage elements (e.g., holographic storage elements), and electrochromic devices (e.g., electrochromic displays).

The contents of all publications cited herein (e.g., patents, patent application publications, and articles) are hereby incorporated by reference in their entirety.

The following examples are illustrative and not intended to be limiting.

Example 1

Method of Forming a Smooth Electrode Layer

Two monomers, SYNASIA S-21 (3,4-epoxycyclohexylmethyl-3,4-epoxycyclohexanecarboxylate, 220 g) and SYNASIA S-28 (bis((3,4-epoxycyclohexyl)methyl)adipate, 200 g) obtained from Synasia Inc. (Metuchen, N.J.) were added to a 500 ml wide mouth amber glass bottle and mixed by using an overhead stainless steel stirrer. Under subdued light, a solid photoinitiator bis(4-tert-butylphenyl)iodonium hexafluoroantimonate (4.4 g) obtained from Hampford Research (Stratford, Conn.) and a sensitizer isopropylthioxanthone (2.2 g) obtained from Lambson Ltd. (West Yorkshire, UK) were added sequentially with continued stirring. The bottle was loosely sealed around the stirrer shaft with aluminum foil and the stirring was continued for 4 hours at room temperature, at which time all of the solids had dissolved. After the stirrer was removed, the bottle was sealed with a Teflon lined screw cap. The solution thus obtained was used in the next step as the filler solution.

An ink containing silver nanoparticles having an average diameter of about 10-30 nm dispersed in an aqueous solution was printed on a smooth surface of a first PET substrate (i.e., a release substrate) to form a metal grid. The article thus formed was then brought into contact with a second PET substrate (i.e., a receiving substrate) with a primer layer having a thickness of about 0.5 micron. The primer layer was formed by coating a blend of L7063/VITEL 2700/BOSCODUR 16 obtained from Bostik, Inc. (Middleton, Mass.) at a dry weight ratio of 1.67:1.0:0.054 to the second PET substrate. The filler solution prepared above was then disposed into the gap between the two PET 7" wide substrates at a flow rate of 0.8 ml/minute. The article thus formed was then passed through a pair of nip rollers to laminate the two PET substrates together at a web speed of 2 fpm. The nip rollers had a nip pressure of 10 psi, an unwind tension of 3.0 psi, and a rewind tension of 3.0 psi. The filler solution was then cured by exposing the laminate to the light from 2 Phoseon LED lamps (390 nm peak emission, 1.1 mJ/cm2 delivered by each) positioned on each side of the laminate. The article thus formed was post cured by heating at 60° C. for 20 hours in roll format or by heating at 85° C. for 30 minutes to obtain optimal cure. The release substrate was then peeled off to form a silver grid electrode embedded in a hardened electrically insulating polymer layer on the receiving substrate.

The smoothness of the embedded grid was measured by using an Ambios XP-1 surface profilometer. In surface scans of 5 mm sections of the grid that crossed 9 individual lines, the root mean square surface roughness RMS was measured to be about 5 nm.

Example 2

Photovoltaic Cells Containing Different Amounts of Electrically Conductive Polymer in the Middle Layer in Bottom Electrode Photovoltaic cell (1) in this Example was prepared as follows: The electrode layer prepared in Example 1 was coated with a layer containing ITO (an electrically conductive oxide), polyethylenimine (PEI; a hole blocking material) and diglycidyl glycerol either (DEG, a cross-linking agent) by using a dispersion containing these three compounds to form a bottom electrode. The ratio of the weight of ITO and the total weight of PEI and DEG was about 8:1. The article thus formed was subsequently coated with a photoactive layer containing a conjugated polymer and PCBM, a hole carrier layer containing a PEDOT:PSS, and a silver top electrode. Photovoltaic cells (2) and (3) were prepared in a manner similar to that of photovoltaic cells (1) except that PEDOT layers that were 20% and 40% by weight of the bottom electrode were respectively coated onto the electrode layer prepared in Example 1 before the ITO/PEI-DEG layer was coated. The PEDOT layers were prepared using ORGACON HBS5 obtained from Agfa. Photovoltaic cells (4)-(6) were prepared in a manner similar to Photovoltaic cells (1)-(3), respectively, except that the electrode layer prepared in Example 1 was replaced with an ITO/metal/ITO (IMI) electrode.

The properties of photovoltaic cells (1)-(6) were measured under 1.5 AM conditions. The results are summarized in Table 1 below.

TABLE 1

| Cell | ITO/PEI-DEG: %/% | PEDOT level in bottom electrode | $V_{oc}$ (V) | $J_{sc}$ (mA/cm$^2$) | $V_{max}$ (V) | $J_{max}$ (mA/cm$^2$) | Eff (%) | FF | $R_{series}$ (Ω/Sq) | Yield |
|---|---|---|---|---|---|---|---|---|---|---|
| (1) | 8/1 | Control | 0.534 | 8.65 | 0.396 | 6.83 | 2.70 | 58.50 | 10.74 | 12 of 12 |
| (2) | 8/1 | 20% | 0.532 | 9.29 | 0.387 | 7.31 | 2.83 | 57.27 | 11.07 | 11 of 12 |
| (3) | 8/1 | 40% | 0.541 | 8.50 | 0.372 | 6.25 | 2.33 | 50.58 | 15.03 | 10 of 12 |
| (4) | PEI-DEG only | Control | 0.521 | 9.93 | 0.356 | 7.57 | 2.70 | 52.16 | 14.36 | 9 of 12 |
| (5) | PEI-DEG only | 20% | 0.533 | 9.58 | 0.336 | 6.51 | 2.19 | 42.90 | 20.17 | 7 of 12 |
| (6) | PEI-DEG only | 40% | 0.526 | 8.93 | 0.333 | 5.81 | 1.93 | 41.10 | 21.87 | 3 of 8 |

The results showed that photovoltaic cells (1)-(3) all possessed bottom electrodes with significantly lower sheet resistance than the bottom electrode in photovoltaic cells (4)-(6). Further, photovoltaic cells (1)-(3) all exhibited significantly better fill factors and production yields than those of photovoltaic cells (4)-(6), respectively. In addition, a comparison between cells (3) and (4) showed that including a certain amount of PEDOT in the bottom electrode lowered cell efficiency when the bottom electrode included IMI. Unexpectedly, a comparison between cells (1) and (2) showed that including a certain amount of PEDOT in the bottom electrode increased cell efficiency when the bottom electrode included silver grid.

Example 3

Photovoltaic Cells Containing Different Amounts of Electrically Conductive Metal Oxide in the Hole Blocking Material in Bottom Electrode Photovoltaic cells (7)-(12) were prepared in a manner similar to photovoltaic cell (1) described in Example 2 above except that they including the following weight ratio between ITO, PEI, and DEG: (7) 1:1:1, (8) 2:1:1, (9) 3:1:1, (10) 4:1:1, (11) 5:1:1, and (12) 3:1:1.

The properties of photovoltaic cells (7)-(12) were measured under 1.5 AM conditions. The results are summarized in Table 2 below.

TABLE 2

| Cell | ITO/PEI/DEG | Cell Area | $V_{oc}$ (V) | $J_{sc}$ (mA/cm$^2$) | $V_{max}$ (V) | $J_{max}$ (mA/cm$^2$) | % Eff | FF | Rs (Ω/Sq) | Yield |
|---|---|---|---|---|---|---|---|---|---|---|
| (7) | 1/1/1 | 0.69 | 0.511 | 10.18 | 0.32 | 6.96 | 2.26 | 43.33 | 19.62 | 12 of 12 |
| (8) | 2/1/1 | 0.75 | 0.503 | 11.14 | 0.35 | 8.37 | 2.92 | 52.03 | 11.63 | 12 of 12 |
| (9) | 3/1/1 | 0.67 | 0.502 | 11.72 | 0.36 | 8.87 | 3.20 | 54.43 | 9.39 | 8 of 8 |
| (10) | 4/1/1 | 0.72 | 0.500 | 11.26 | 0.36 | 8.62 | 3.07 | 54.48 | 9.54 | 12 of 12 |
| (11) | 5/1/1 | 0.78 | 0.505 | 11.55 | 0.36 | 8.97 | 3.22 | 55.25 | 9.49 | 8 of 12 |
| (12) | 8/1/1 | 0.70 | 0.515 | 10.68 | 0.37 | 8.16 | 3.05 | 55.53 | 10.05 | 8 of 8 |

The results showed that photovoltaic cells containing from the ITO/PEI/DEG at a weight ratio of from about 3/1/1 to about 5/1/1 exhibited improved cell efficiencies.

Other embodiments are in the claims.

What is claimed is:

1. An article, comprising:
a first electrode;
a second electrode; and
a photoactive layer disposed between the first and second electrodes,
wherein the first electrode comprises first, second, and third layers, the first layer comprises a grid and an electrically insulating material, wherein the electrically insulating material is disposed in the spaces formed by the grid, and wherein the first layer has a root mean squared surface roughness of at most about 20 nm, the second layer is between the first and third layers and comprises an electrically conductive material, and the third layer is between the second layer and the photoactive layer and comprises a hole blocking material and an electrically conductive metal oxide,
wherein the electrically insulating material has a surface contacting the second layer, the grid has a surface contacting the second layer, and the surface of the electrically insulating material is substantially at the same level as the surface of the grid and the electrically insulating material does not cover the surface of the grid that contacts the second layer, and
the article is configured as a photovoltaic cell.

2. The article of claim 1, wherein the grid comprises a metal or an alloy.

3. The article of claim 2, wherein the grid comprises gold, silver, copper, aluminum, nickel, palladium, platinum, titanium, or an alloy thereof.

4. The article of claim 1, wherein the electrically insulating material comprises an acrylate polymer, a urethane polymer, an epoxy polymer, or a combination thereof.

5. The article of claim 1, wherein the electrically conductive material comprises metal nanoparticles or an electrically conductive polymer.

6. The article of claim 5, wherein the metal nanoparticles have a shape of a sphere, tube, rod, or needle.

7. The article of claim 5, wherein the electrically conductive polymer comprises a polythiophene.

8. The article of claim 1, wherein the hole blocking material comprises a polyamine.

9. The article of claim 8, wherein the polyamine comprises a polyethylenimine.

10. The article of claim 8, wherein at least some molecules of the hole blocking material are cross-linked by a cross-linking agent.

11. The article of claim 10, wherein the cross-linking agent comprises an epoxy-containing compound.

12. The article of claim 10, wherein the cross-linking agent comprises glycerol triglycidyl ether or glycerol diglycidyl ether.

13. The article of claim 1, wherein the electrically conductive metal oxide comprises indium tin oxide.

14. The article of claim 1, wherein the first layer has a root mean squared surface roughness of at most about 5 nm.

15. The article of claim 1, wherein the first layer has a maximum peak height of at most about 200 nm.

16. The article of claim 1, wherein the first electrode has a light transmittance of at least about 70% during use of the article.

17. The article of claim 1, wherein the first electrode has a sheet resistance of at most about 10 ohm/square.

18. An article, comprising:
a first electrode;
a second electrode; and
a photoactive layer disposed between the first and second electrodes,
wherein the first electrode comprises a first layer and a second layer, the first layer comprises a grid and an electrically insulating material, the first layer has a root mean squared surface roughness of at most about 20 nm, wherein the second layer is between the first layer and the photoactive layer, and the second layer comprises an electrically conductive material, the electrically insulating material has a surface contacting the second layer, a third layer between the second layer and the photoactive layer wherein the third layer comprises a hole blocking material and an electrically conductive metal oxide, the grid has a surface contacting the second layer, and the surface of the electrically insulating material is substantially at the same level as the surface of the grid, and the electrically insulating material does not cover the surface of the grid that contacts the second layer, and the article is configured as a photovoltaic cell.

19. The article of claim 18, wherein the first layer has a root mean squared surface roughness of at most about 5 nm.

* * * * *